(12) United States Patent
Choi et al.

(10) Patent No.: US 6,362,054 B1
(45) Date of Patent: Mar. 26, 2002

(54) METHOD FOR FABRICATING MOS DEVICE WITH HALO IMPLANTED REGION

(75) Inventors: Seungmoo Choi; Donald Thomas Cwynar; Scott Francis Shive; Timothy Edward Doyle; Felix Llevada, all of Orlando, FL (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/523,782

(22) Filed: Mar. 13, 2000

(51) Int. Cl.[7] ............................................. H01L 21/336
(52) U.S. Cl. ........................................ 438/266; 438/301
(58) Field of Search ................................ 438/257–267, 438/585, 231, 287, 301

(56) References Cited

U.S. PATENT DOCUMENTS

| | | |
|---|---|---|
| 5,580,804 A | 12/1996 | Joh |
| 5,631,490 A | 5/1997 | Dutta et al. |
| 5,650,340 A | 7/1997 | Burr et al. |
| 5,744,372 A | 4/1998 | Bulucea |
| 5,899,719 A * | 5/1999 | Hong .......................... 438/289 |
| 5,939,899 A | 8/1999 | Frommer et al. |
| 6,051,458 A * | 4/2000 | Liang et al. ................. 438/224 |
| 6,168,995 B1 * | 1/2001 | Kelley et al. ................ 438/266 |
| 6,214,683 B1 * | 4/2001 | Xiang et al. ................. 438/305 |
| 6,232,166 B1 * | 5/2001 | Ju et al. ...................... 438/231 |
| 6,232,209 B1 * | 5/2001 | Fujiwara et al. ............ 438/585 |
| 6,248,635 B1 * | 6/2001 | Foote et al. ................. 438/287 |
| 6,255,182 B1 * | 7/2001 | Wieczorek et al. ......... 438/305 |
| 6,261,934 B1 * | 7/2001 | Kraft et al. .................. 438/592 |

* cited by examiner

*Primary Examiner*—John F. Niebling
*Assistant Examiner*—Walter L. Lindsay, Jr.
(74) *Attorney, Agent, or Firm*—Fay, Sharpe, Fagan, Minnich & McKee, LLP

(57) ABSTRACT

A halo implant (42, 44) for an MOS transistor (10) is formed in a semiconductor substrate (12) at a shallow implant angle, relative to normal to the substrate surface (29). A polysilicon gate structure (32, 33) is formed over a gate oxide (28) and then a hard mask (70), such as a TEOS-generated layer of silicon oxide, is deposited on an upper surface (68) of the gate. The mask is etched with a blanket anisotropic etch to form a cap-shaped mask (72). The shape of the cap causes the dopant for the halo implant to penetrate to a depth which follows the contour of the cap. Thus, halo implants may be formed which extend under the gate structure without the need for large angle implants and resultant shadowing problems caused by adjacent devices.

15 Claims, 3 Drawing Sheets

METHOD FOR FABRICATING MOS DEVICE WITH HALO IMPLANTED REGION

FIELD OF THE INVENTION

The present invention relates to reduced-dimension MOS field effect transistors and to the formation of field effect transistors having narrow gate electrodes and reduced dimension source-drain structures.

DESCRIPTION OF THE PRIOR ART

Field-effect transistors, generally referred to as FETs or MOSFETs, are common devices in modern integrated circuits. MOS is the acronym for "metal-oxide-semiconductor," which now encompasses both metal and polysilicon as the gate material.

The basic components of an MOS transistor are: a source that serves as a current input; a drain that serves as a current output; a channel that selectively couples the source and the drain; and a gate that controls the conductivity of the channel. When a forward voltage bias is applied between the source and the drain, the current flowing from the source to the drain, through the channel, is controlled by the gate voltage.

A halo implant, also called a "pocket implant," has been used to reduce "punch through",i.e., to limit lateral diffusion of the source and the drain dopants in MOS transistors. The halo implant is of the conductivity type opposite to that of the source and drain of the MOS device. Like the source/drain implant, it is performed after the gate is defined and before the source/drain diffusion. Due to the masking effect of the gate, the halo implant peak concentration is near the source/drain region. Away from the source/drain edge, under the gate, the depth of the peak halo concentration falls quickly.

To provide a halo implant which extends slightly under the gate, high angle ion implantation is used to form the halo implant. Typically, the ion flux is at an implant angle of approximately 30°, or greater, from normal (perpendicular) to the substrate.

With close packing of devices, shadowing tends to occur due to the large angle employed. Shadowing results from the interference of an adjacent device gate, or other raised feature, with the path of the large angle, ion flux. To avoid the implant shadowing, devices may be spaced further apart. This results in fewer devices being accommodated on a wafer.

There remains a need for a method of halo implantation which overcomes the above-referenced problems, and others.

SUMMARY OF THE INVENTION

In accordance with aspects of the present invention, an MOS device and its method of fabrication are provided. The method includes forming a gate structure with an upper layer of a hard mask material on a substrate. The method further includes etching the hard mask material to remove a portion of the hard mask material and form a contoured mask on the gate structure. The contoured mask varies in thickness across the gate structure. Further, the method includes implanting a halo dopant through the contoured mask into the substrate to form a halo implant.

In accordance with another aspect of the present invention, a method of forming a MOS transistor is provided. The method includes growing a gate oxide layer on a surface of a silicon substrate and depositing a layer of polysilicon on the gate oxide layer. The method further includes forming a layer of a hard mask material on an upper surface of the polysilicon and anisotropically etching the hard mask material to contour the hard mask material. A halo dopant is then implanted into the substrate through the contoured hard mask material at an implant angle which is generally perpendicular to the surface of the substrate to form a halo implant.

BRIEF DESCRIPTION OF THE DRAWINGS

The invention is best understood from the following detailed description when read with the accompanying drawing FIGURES. It is emphasized that various features are not necessarily drawn to scale.

DETAILED DESCRIPTION OF THE INVENTION

For purposes of illustration, the invention will be described in the context of MOS devices. However, it should be readily appreciated that the invention is applicable to semiconductor devices in general, such as MOSFETS, HEMTs, BiCMOS, thin film transistors, and the like.

Figure 1:
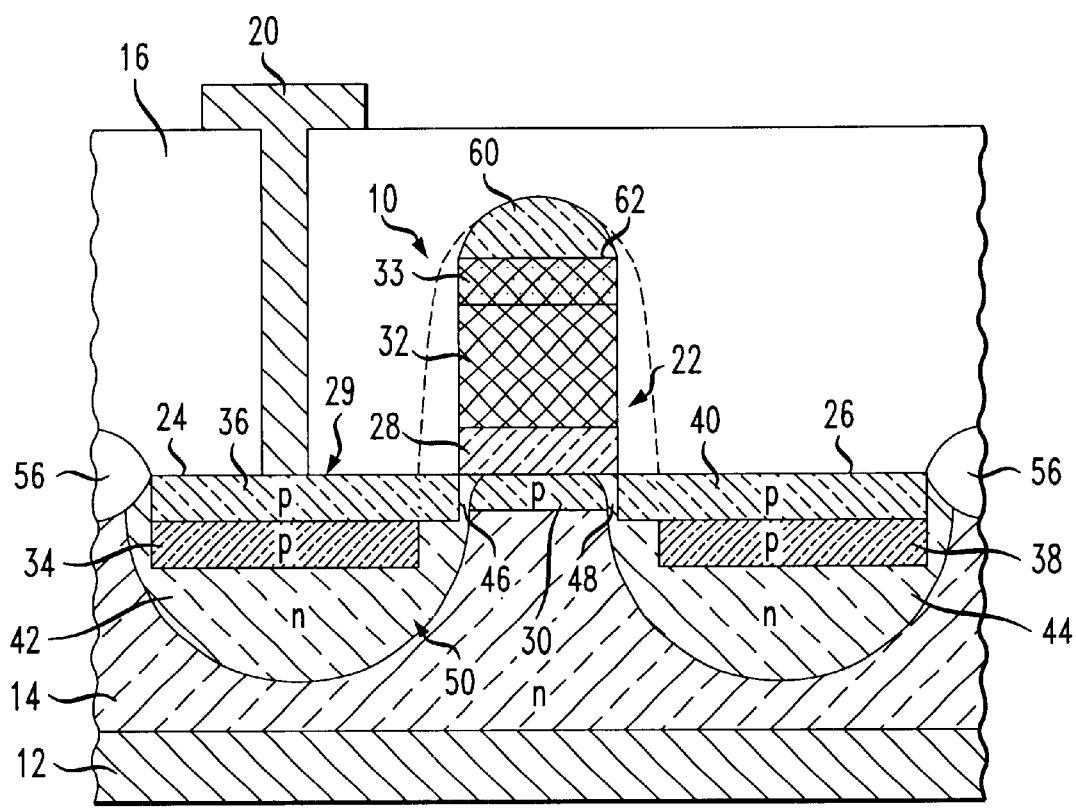
FIG. 1 is a schematic elevational view of a portion of an MOS transistor in accordance with the present invention.

An MOS transistor 10 is illustrated in FIG. 1. The transistor shown is a p-channel transistor, although it should be readily appreciated that n-channel transistors may be similarly formed, with the conductivities of the dopants reversed.

The p-channel transistor 10 is formed, for example, on and within a semiconductor substrate 12 which forms part of a wafer W on which many of such devices may be formed. Suitable substrates are silicon wafers, prepared, for example, by the Czochralski technique. The major surface of the wafer is not critical and any suitable orientation, such as a (100), (110), or (111), is useful. Other substrate materials, such as gallium arsenide, may also be employed.

Defined within substrate is a lightly doped n-well region 14, within and over which the n-channel transistor 10 is formed. The n-well extends downward from the semiconductor substrate surface into its bulk. Alternatively, the bulk semiconductor may be doped, obviating the need for a separate well region. A dielectric film 16 covers the transistor. Contact and via structures provide for electrical connections between transistor 10 and other transistors and devices of an integrated circuit (not shown).

The MOS device 10 comprises a gate 22, and source 24, and drain regions 26. The source serves as a current input and the drain as a current output. A gate oxide 28, such as a layer of grown silicon oxide, is disposed on the surface 29 of the wafer, serves to facilitate the projection of electric fields into a channel 30, defined beneath the gate oxide which selectively couples the source and drain regions 24, 26. Channel 30 is controlled by the voltage applied to gate 22. Thus, when a forward voltage bias is applied between the source and the drain, the current flowing from the source to the drain, through the channel, is controlled by the gate voltage.

The gate 22 may comprise a doped polysilicon layer 32, disposed on the gate oxide, with an upper layer of tungsten silicide 33 thereon. Alternatively, the gate may comprise a polysilicon layer without an upper tungsten silicide layer, or a layer comprising polycide.

In the case of a p-channel transistor, the source is p-type, the channel is p-type, and the drain, p-type. When an electrical bias is applied across the transistor, an inversion occurs in the channel. Source 24 preferably includes a lower, heavily doped source section 34 and an upper, lightly doped source section 36, adjacent the channel. Similarly, drain 26 preferably includes a heavily doped, lower drain section 38 and a lightly doped, upper drain section 40. The p-channel transistor 10 also includes a first, lightly-doped n-type halo implant region, or pocket implant 42 adjacent the source (hereinafter the source halo implant), and a second, lightly-doped n-type halo implant region 44 adjacent the drain 26 (hereinafter the drain halo implant).

It should be readily appreciated that n-channel transistors may be similarly formed, but with an n-type source 24, an n-type channel 24 an n-type drain 26, and lightly-doped p-type halo implants 42, 44 (i.e., of a conductivity which is the opposite of the source and drain). CMOS devices may have both n-channel and p-channel in adjacent regions of a substrate.

The source and drain halo implant regions 42, 44 reduce diffusion from the source 34 to the drain 38 and thus contribute to an enhanced breakdown voltage for the transistor 10. Each halo implant 42, 44 has a side-wall section 46, 48, respectively, which extends vertically downward adjacent the channel 30, and either just outside or slightly under the gate 22. This portion of the halo implant region blocks the movement of ions from the source into the channel or from the drain into the channel. A lower section 50, 52 of each of the halo implants may extend under the heavily doped source and drain regions, respectively, from the lower end of the vertical sidewall section 46, 48. Under the gate 22, the halo implant falls away rapidly, so that the length of the channel is substantially unaffected by the halo implants.

A typical integrated circuit employing the MOS device of the present invention has a substrate 12 which is nominally 650 μm thick. The polysilicon gate is about 0.16 μm in length and 0.2–0.4 μm thick. The gate oxide is about 26 Å thick, or less. It will be readily appreciated, however, that the invention is also applicable to larger or smaller devices.

For 0.16 μm technology, the average dopant concentration of the well region 14, excluding the source, drain and halo implants, is between about $1 \times 10^{14}$ and $5 \times 10^{16}$ atoms/cm$^3$. The dopant concentrations for the source region 34 and the drain region 38 are preferably between about 1 and $2 \times 10^{20}$ atoms/cm$^3$ for the heavily doped regions and between about $10^{19}$ and $8 \times 10^{19}$ atoms/cm$^3$ for the lightly doped regions. The channel region 30 has a dopant concentration of less than about $1 \times 10^{16}$ atoms/cm$^3$, more preferably, between about $1 \times 10^{14}$ and $1 \times 10^{16}$ atoms/cm$^3$, most preferably, about $1 \times 10^{15}$ atoms/cm$^3$. Dopant concentration in the halo implants 42, 44 is preferably at least $1 \times 10^{16}$ atoms/cm$^3$, more preferably, between about $1 \times 10^{17}$ and $1 \times 10^{18}$ atoms/cm$^3$. As the dopant concentrations generally vary inversely with device size; as device size increases, the dopant concentration increases. Thus, the recited concentrations may increase for larger device sizes.

Formation of the gate oxide 28, polysilicon layer or layers, 32, 33 and lightly doped and heavily doped regions 34, 36, 38, 40 may be achieved by conventional integrated circuit fabrication methods. For example, the following process may be used. First the well 14 is formed. An n-type implant defines the n-well 14 with somewhat higher concentration than substrate 12.

Field oxide 56 (silicon dioxide) is then grown to a thickness of about 0.3 μm on the silicon wafer surface. Alternatively, shallow trench isolation is used to isolate the devices.

Figure 2:
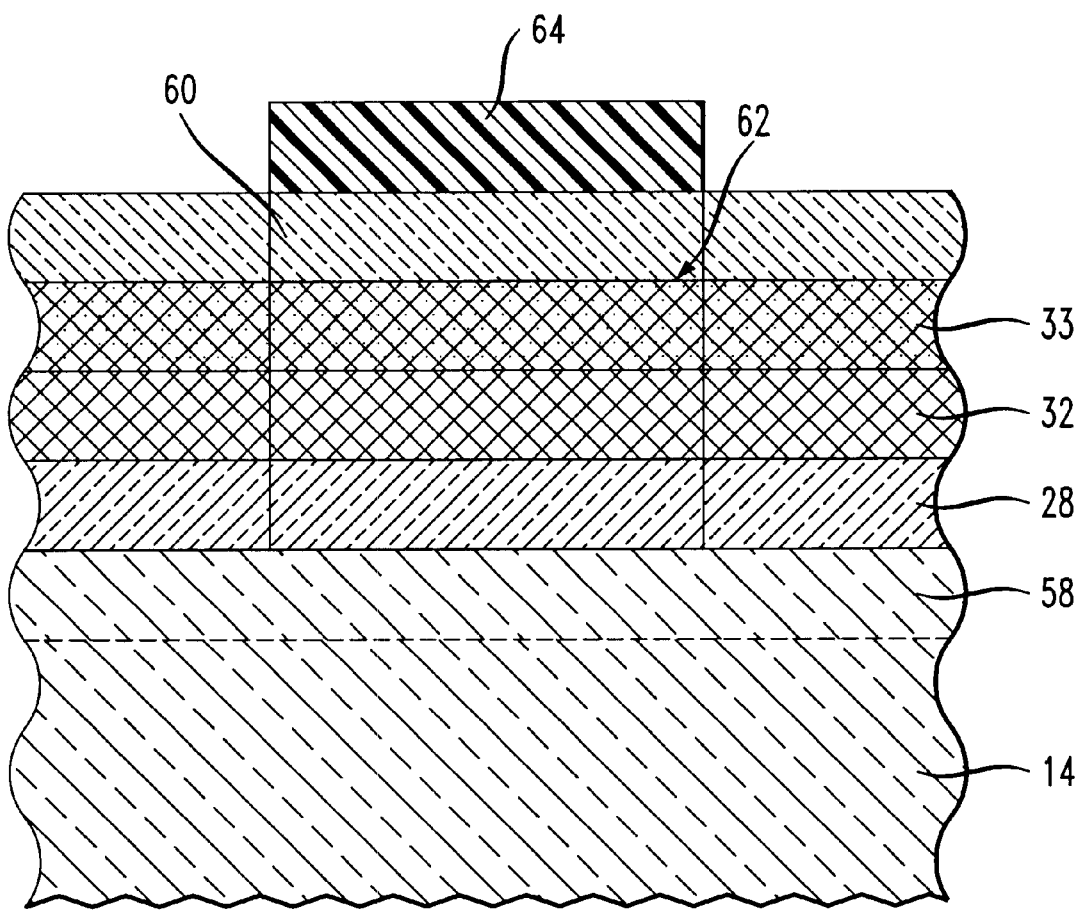
FIG. 2 is an elevational view of a wafer during preparation of the transistor of FIG. 1, prior to etching of gate oxide and polysilicon layers.

A voltage adjust implant is performed while the n-well tub is defined. Dopant atoms, such as boron, are implanted into an upper region of the n-well 14 in the region at which the gate is to be formed to define a p-channel implant as shown in FIG. 2. This implant is referred to as the threshold adjust implant and is used to set the threshold voltage at the gate. Preferably, the boron threshold adjust implant provides a nominal turn on (about 0.4 volts for 0.16 μm technology) for to-be-defined channel 24 in both PMOS and NMOS devices.

The gate 22 layers are then deposited. Specifically, an oxide for the gate oxide layer 28 is grown over the substrate surface, for example, by thermal oxidation. Polysilicon for the gate 22 is then deposited over the gate oxide. Various techniques, such as physical deposition, chemical vapor deposition, or epitaxial growth, may be used to perform this step. Preferably, an upper layer 34 of tungsten silicide, is then deposited over the polysilicon, by, for example, sputtering.

A layer 60 of a hard mask material is then deposited on an upper surface of the gate -i.e., on an upper surface 62 of the tungsten silicide layer 34. The mask material is one which is etched selectively over polysilicon or silicon. The hard mask material is preferably an oxide, such as silicon oxide, or silicon nitride. However, other oxides which are deposited by chemical vapor deposition (CVD) may also be used. The silicon oxide may be formed, for example, by LPCVD or PECVD using a plasma comprising tetraethylorthosilicate (TEOS), and optionally hydrogen, to a thickness of between about 500 and 2000 Å, preferably, about 1000–1500 Å.

The gate is then defined by patterning the hard mask. For example, a layer of photoresist 64 is deposited on the area of the gate, as shown in FIG. 2 and then the unwanted hard mask material is removed by reactive ion etching (RIE) using a halogenous gas as a source of ions, such as CHF$_3$, CF$_4$, a mixture thereof, or the like. The remaining photoresist material is then stripped to expose an upper surface 66 of the hard mask. The unwanted portions of the tungsten silicide layer 33, the polysilicon layer 32 and the gate oxide are then etched away to define the gate, using the hard mask material as a mask. RF plasma etching with an HBr-based plasma is suitable for this step.

Doping of the lightly doped source and drain regions 34, 38 can then take place. For example, boron may be implanted at moderate concentration and low energy (around 15 KeV) to create a p-type lightly doped drain implant in n-well 14. Alternatively, the order of the lightly doped drain implant and the halo implant may be reversed.

Figure 3:
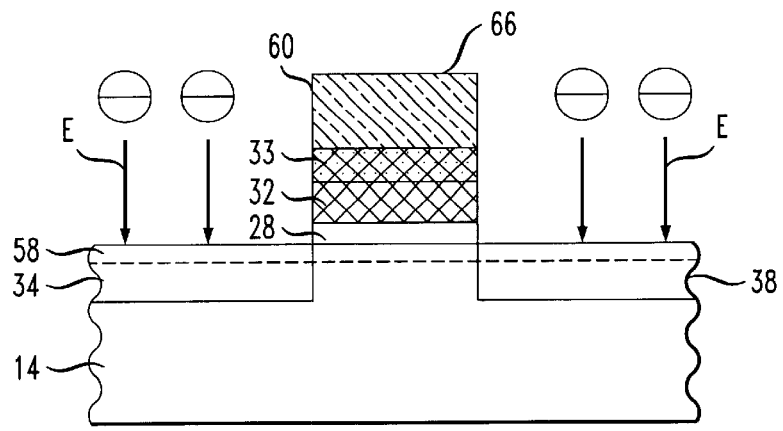
FIG. 3 is an elevational view of a wafer during preparation of the transistor of FIG. 1, following etching of gate oxide and polysilicon layers and prior to etching of a hard mask.

The hard mask layer 60 is then etched with a blanket anisotropic etch, as indicated by arrows E in FIG. 3. The anisotropic etch may be carried out in a reactive ion etch (RIE) reactor, using argon. A preferred etch is carried out at about 1 mTorr.

Figure 4:
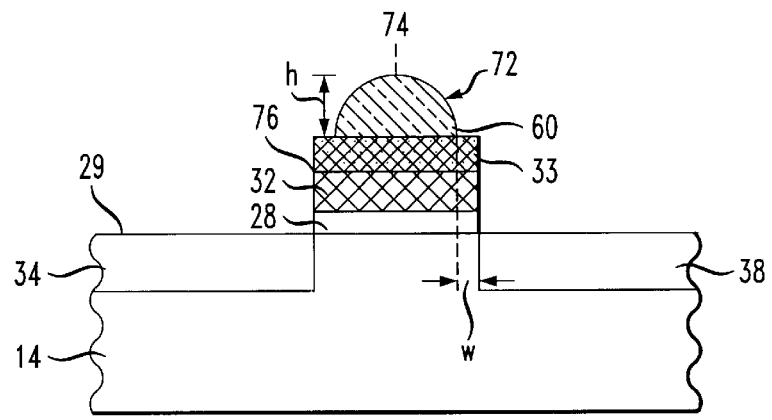
FIG. 4 is an elevational view of a wafer during preparation of the transistor of FIG. 1, following etching of a hard mask.

Because of the anisotropic nature of the etch, the hard mask 60 is not etched equally across its width. The anisotropic etch leaves the hard mask with a contoured, cap shape, as shown in FIG. 4. The curved profile of the cap 72, thus formed, has a maximum thickness (height h above the surface 62 of the polysilicon layers) at a mid-point 74 of the mask material and a minimum thickness at or adjacent to the side edges 76 of the gate.

The contour of the contoured mask influences the depth profile of the subsequent halo implant under the gate structure. The thickness of the mask material may be selected such that the maximum height h of the mask cap 72, following etching, is approximately equal to, or slightly greater than, the depth of the lightly doped regions adjacent the gate. For example, if the lightly doped regions are to be about 1000 Å in depth adjacent the gate, the maximum height h of the mask cap 72 is also preferably about 1000 Å, after etching.

The amount of mask material 70 removed in the blanket anisotropic etch can also be used to determine how far under the gate the halo implant 42, 44 extends. For example, the mask cap 72 of FIG. 4, does not extend fully to the periphery 76 of the gate. A width w is free of mask material 70. This type of mask can be used to form a halo implant region 42, 44 that extends under the gate by an amount roughly equal to the width w, and then rapidly trails off, following the profile of the cap 72. A mask 70 which extends fully to the periphery of the gate can be used to create a shallower under-the-gate halo implant.

The shape of the stack (polysilicon and mask cap 22,72) is then used to create a correspondingly-shaped halo implant 42, 44 in the substrate using an halo implant at an implant angle which is normal (perpendicular), or close to normal, to the surface of the substrate. The implant is preferably at medium energy (nominally around 90 KeV phosphorus in an n-channel transistor, or around 65 KeV for boron in a p-channel transistor).

The depth of penetration of ions of a given energy is dependent on the thickness of the material through which the ions must travel. The present invention takes advantage of the contour of the cap 72 to provide a varying thickness through which the ions must travel, to implant the halo dopant at a similarly contoured depth. The energy of the implant material, phosphorus, for example, in the case of the n-well, is selected, so that the ions have sufficient energy to penetrate through the stack to the substrate beneath only in a region 46, 48 adjacent the edges 76 of the stack, where the hard mask cap 72 is thinnest or absent. In the center 74 of the stack, where the hard mask 72 is thicker, the ions do not have sufficient energy to penetrate to the channel region 30 below.

Figure 5:
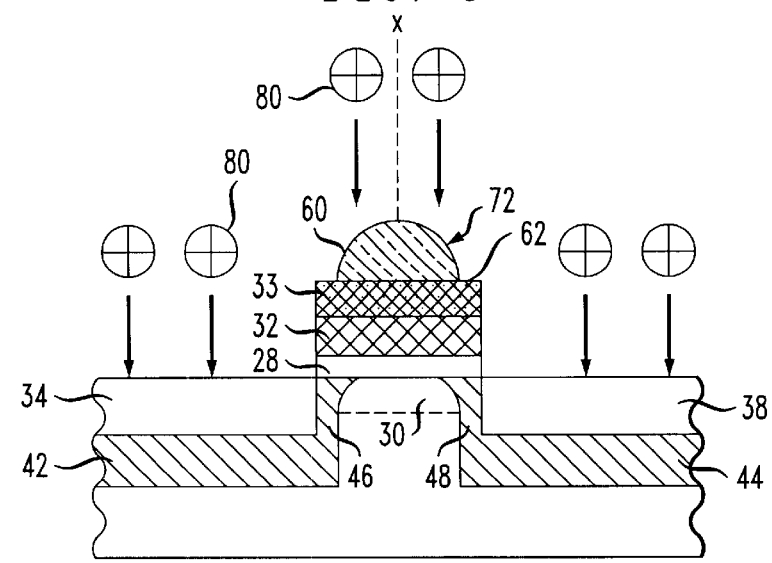
FIG. 5 is an elevational view of a wafer during preparation of the transistor of FIG. 1, following implant of a halo dopant.

The profile of the vertical portion 46,48 of the halo implant, adjacent the channel 30, is thus generally defined by the profile of the mask material, as shown in FIG. 5.

As will readily be appreciated, p-well transistors may be similarly halo implanted and lightly doped source and drain regions formed. For example, phosphorus may be implanted at moderate concentration and low energy, around 25 KeV, to create an n-type lightly doped drain implant, then boron is implanted at high energy, nominally 65 KeV into the p-well to form a p-halo implant. CMOS devices may be implanted in both the n and p-wells by first masking, for example, the n-well, implanting the p-well, then removing the mask from the n-well and masking the p-well, and finally, implanting in the n-well.

As will be readily understood other steps in the processing may be included as known in the art. For example, a pad oxide may be grown on the structure to protect the substrate surface prior to the halo implant.

After the halo implant is created, dopant atoms are implanted into regions 36 and 38 to form the heavily doped regions of the source and drain. The wafer W, which may have many such devices formed thereon is then annealed to repair the implant damage (restore the silicon lattice structure) and to activate the dopants (placing the dopant atoms on vacant sites). Finally, metal 20 and one or more intermediate layers 16 of an insulation material, such as a dielectric material of doped silicon dioxide are formed. The metal provides the necessary connections with other devices on the wafer while the doped oxide serves as an intermediate dielectric to isolate the metal interconnect level from the polysilicon 32, 33. The steps for fabricating an actual MOS transistor involves many more steps. These steps are well known and are described in S. M. Sze, "VLSI Technology," 2nd. ed., New York: McGraw-Hill (1988).

While it is preferable to use a perpendicular halo implant (i.e., an implant angle at about 0°, and preferably no more than 7° relative to an axis x perpendicular with the substrate surface 29), for forming symmetrical halo implants adjacent both the source 34 and drain 38 simultaneously, the implant angle could obviously be varied if desired to selectively halo implant either the source or the drain. For, example, the implant angle may be 7–10° or more from perpendicular, without resulting in shadowing by adjacent devices, depending on the pitch and dimensions of the devices. Where device spacing is not critical, the angle of implant may be as much as 30°, although at such large angles, the halo implant will extend further under the gate than may be desirable for some applications.

The method of halo implantation thus described allows implantation at shallow, i.e., generally perpendicular implant angles, which permits closer spacing of transistors on a wafer, without appreciably increasing processing time and thermal requirements.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A method of forming a MOS transistor comprising the steps of:
   a) forming a gate structure on a substrate with an upper layer of a hard mask material;
   b) anisotropically etching the hard mask material to remove a portion of the hard mask material and form a contoured mask on the gate structure, the contoured mask having a curved profile which varies in thickness across the gate structure such that a minimum thickness of the mask is at or adjacent a side edge of the gate structure; and
   c) implanting a halo dopant through the contoured mask into the substrate to form a halo implant, the profile of the mask influencing a depth profile of the halo implant under the gate structure.

2. The method of claim 1, further including prior to step b):
   patterning the layer of hard mask material with a layer of photoresist material and removing an unpatterned portion of the hard mask material and gate layers to define the gate.

3. The method of claim 1, further including:

implanting a source/drain dopant into the substrate to form a source region and a drain region adjacent the gate.

4. The method of claim 3, wherein the step of forming the halo implant is carried out prior to the step of implanting the source/drain dopant.

5. The method of claim 1, wherein the step of forming the halo implant includes implanting the halo dopant at an implant angle of less than 30 degrees from an axis which is perpendicular to the surface of the substrate.

6. The method of claim 5, wherein the implant angle is up to about seven degrees from the perpendicular axis.

7. The method of claim 6, wherein the implant angle is generally perpendicular to the surface of the substrate.

8. A method of forming a semiconductor device comprising the steps of:

a) forming a gate structure on a substrate with an upper layer of a hard mask material;

b) etching the hard mask material to remove a portion of the hard mask material and form a contoured mask on the gate structure, the mask, after etching, having a contour which is thinner adjacent a peripheral edge of the gate and increases in thickness away from the peripheral edge of the gate; and c) implanting a halo dopant through the contoured mask into the substrate to form a halo implant.

9. The method of claim 8, wherein the step of etching the hard mask material includes anisotropically etching the hard mask material.

10. The method of claim 8, wherein the step of implanting a halo dopant includes selecting the energy of the dopant such that the dopant penetrates the gate into the substrate at ends of a channel region defined under the gate, without penetrating the gate in a central portion of the channel.

11. The method of claim 1, wherein the hard mask material is silicon dioxide.

12. A method of forming a MOS device, the method comprising:

a) growing a gate oxide layer on a surface of a silicon substrate;

b) depositing a layer of polysilicon on the gate oxide layer;

c) forming a layer of a hard mask material on an upper surface of the polysilicon;

d) after step c), implanting a source/drain dopant into the substrate to define source and drain regions;

e) after step d), anisotropically etching the hard mask material to contour the hard mask material; and f) implanting a halo dopant into the substrate through the contoured hard mask material at an implant angle which is less than about seven degrees from normal to the surface of the substrate to form a halo implant.

13. The method of claim 12, wherein halo dopant has an energy which is sufficient to penetrate the polysilicon gate structure only in regions adjacent a periphery of the gate structure.

14. The method of claim 13, further including:

the step of implanting including implanting a source/drain dopant into the substrate of a conductivity type opposite to a conductivity type of the halo dopant to define source and drain regions adjacent opposite sides of a gate structure.

15. A method of forming a semiconductor device comprising the steps of:

a) forming a gate structure on a substrate surface with an upper layer of a hard mask material;

b) etching the hard mask material to remove a portion of the hard mask material and form a contoured mask on the gate structure, the contoured mask having a profile of reduced thickness in a direction perpendicular to substrate surface around the periphery of the gate structure and increased thickness at a mid point of the gate structure; and c) using the contour of the mask to create a contoured halo implant in the substrate beneath the gate structure.

* * * * *